(12) United States Patent
Hirobe

(10) Patent No.: US 7,724,588 B2
(45) Date of Patent: May 25, 2010

(54) OVERDRIVE WRITE METHOD, WRITE AMPLIFIER POWER GENERATING CIRCUIT, AND SEMICONDUCTOR MEMORY DEVICE INCLUDING THE SAME

(75) Inventor: Atsunori Hirobe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 581 days.

(21) Appl. No.: 11/671,259

(22) Filed: Feb. 5, 2007

(65) Prior Publication Data
US 2009/0010081 A1   Jan. 8, 2009

(30) Foreign Application Priority Data
Feb. 6, 2006   (JP)   ............... 2006-028879

(51) Int. Cl.
*G11C 7/00*   (2006.01)
(52) U.S. Cl. ............... 365/189.16; 365/189.09; 365/191; 365/201
(58) Field of Classification Search ............ 365/189.16, 365/189.09, 201, 191
See application file for complete search history.

(56) References Cited

U.S. PATENT DOCUMENTS

| 5,764,580 | A  | * | 6/1998  | Suzuki et al. ............... 365/205 |
| 6,853,593 | B1 | * | 2/2005  | Bae ....................... 365/189.09 |
| 7,020,043 | B1 | * | 3/2006  | Lee ......................... 365/230.06 |
| 7,317,653 | B2 | * | 1/2008  | Park et al. ............... 365/230.03 |
| 7,362,631 | B2 | * | 4/2008  | Jang ........................... 365/201 |
| 7,436,732 | B2 | * | 10/2008 | Hirobe ....................... 365/226 |

FOREIGN PATENT DOCUMENTS

| JP | 10-255470 A   | 9/1998 |
| WO | WO 97/24729 A | 7/1997 |

* cited by examiner

*Primary Examiner*—Pho M. Luu
(74) *Attorney, Agent, or Firm*—Sughrue Mion, PLLC

(57) ABSTRACT

A write amplifier power generating circuit includes a control unit for changing an output voltage. In a first write cycle in which a pair of bit lines are being amplified, a write operation is performed by an overdrive write method in which a high level from a write amplifier is set to a first voltage (for example, a power supply voltage). In a second write cycle after amplification in the pair of the bit lines has been completed, a write operation is performed by a write method in which the high level from the write amplifier is set to a second voltage (for example, an internal voltage).

13 Claims, 10 Drawing Sheets

OVERDRIVE WRITE METHOD, WRITE AMPLIFIER POWER GENERATING CIRCUIT, AND SEMICONDUCTOR MEMORY DEVICE INCLUDING THE SAME

This application claims priority to prior Japanese patent application JP 2006-28879, the disclosure of which is incorporated herein by reference.

BACKGROUND OF THE INVENTION

1. Field of the Invention

The present invention relates to semiconductor memory devices, and in particular, relates to an overdrive write method in which a write operation is performed by an overdrive method, a write amplifier power generating circuit, and a semiconductor memory device that includes the same.

2. Description of the Related Art

In recent semiconductor memory devices, high-speed processing and low power consumption are achieved. A typical method for achieving high-speed processing and low power consumption is the Boosted Sense Ground (BSG) method. In the BSG method, internal voltages VDL and VSL are used as the high and low levels of bit line read signals. The internal voltage VDL is lower than a power supply voltage VEXT supplied from an external source by a predetermined amount, and the internal voltage VSL is higher than a ground voltage GND by a predetermined amount. The internal voltage VDU the internal voltage VSL is supplied as a power supply voltage of an internal circuit in which the BSG method is adopted. The internal voltage VDL/the internal voltage VSL is smaller than the power supply voltage VEXT/the ground voltage GND. Thus, the signal amplitude in an internal circuit that includes a complementary metal-oxide semiconductor (CMOS) is also the internal voltage VDL/the internal voltage VSL. Low power consumption is achieved by operating an internal circuit with a low voltage in this way, and moreover, high-speed data transfer is achieved by suppressing noise by a small signal amplitude.

However, in the BSG method, although high-speed data transfer is achieved by a small signal amplitude, a problem exists in that a restore operation of a cell is slow. Thus, an overdrive sense method is adopted. In the overdrive sense method, a power supply voltage applied to a sense amplifier is increased at the beginning of a restore operation of a cell. Moreover, in a write operation, when the amplitude of an input signal is small, the capability in inverting a bit line pair falls short, and thus the write time gets longer. Thus, even when a write operation is performed, the overdrive method is used. In the overdrive method, the power supply voltage VEXT and the ground voltage GND are supplied.

Some types of overdrive method are described in, for example, International Publication No. WO97/24729 and Japanese Unexamined Patent Application Publication No. 10-255470. General overdrive methods described in International Publication No. WO97/24729 and Japanese Unexamined Patent Application Publication No. 10-255470 will now be described. In the description of International Publication No. WO97/24729, a power supply voltage VEXT and a ground voltage GND are supplied as operating power supplies for a sense amplifier at the beginning of a sensing operation. After sensing and amplification operations are quickly performed, internal voltages VDL and VSL are supplied. In the description of Japanese Unexamined Patent Application Publication No. 10-255470, a power supply voltage VEXT and a ground voltage GND are supplied as operating power supplies for a write amplifier only for a predetermined period. After a sense amplifier is rapidly inverted, the operating power supplied for the write amplifier are internal voltages VDL and VSL.

In a write operation by the overdrive method described in Japanese Unexamined Patent Application Publication No. 10-255470, the high and low levels of write signals from a write amplifier WAMP are the power supply voltage VEXT and the ground voltage GND for the predetermined period until voltages of a bit line pair cross each other. After the predetermined period, the high and low levels of write signals are changed to the internal voltages VDL and VSL so that the level to be written to a memory cell and the signal levels in a pair of complementary bit lines BIT T and BIT N are the internal voltages VDL and VSL. In this way, the substantial achieved amplitude of write signals in the pair of the complementary bit lines BIT T and BIT N is set so as to be larger than the achieved amplitude of amplified read signals in the pair of the complementary bit lines BIT T and BIT N, and a write operation by the overdrive method is performed.

However, the inventor found that a problem existed with these overdrive write methods in the case of successive write operations. The problem is that, when successive write operations are repeated on the same word line, a bit line voltage may be excessively boosted. In this case, an overdrive operation is performed, with the power supply voltage VEXT (VDD), which is higher than the internal voltage VDL, on bit lines in which sufficient voltage difference is generated by performing amplification on the basis of data stored in a memory cell. In this way, when an overdrive operation is repeated, the bit line voltage is excessively boosted. This is because the power supply voltage VEXT from a write amplifier, which is higher than the internal voltage VDL, is supplied to the bit lines via an input/output (IO) data line and a column selection switch.

For example, in general, an IO data line and a bit line are connected by a column selection switch YSW that includes an N-channel transistor. The power supply voltage VEXT is applied as the gate voltage of the column selection switch YSW. When the high level of the IO data line is also the power supply voltage VEXT, VEXT−Vtn is applied to the bit line. When successive write operations are performed, in one of the complementary bit lines, the voltage is excessively boosted, so that the voltage is equal to or higher than the internal voltage VDL. When a precharge operation is performed, after the bit line voltage is excessively boosted, a correct reference level cannot be obtained. The precharge operation is performed to charge the complementary bit lines to a reference level (VDL/2).

Thus, in order to obtain a correct reference level in the overdrive write method, the voltage level of the bit line needs to be decreased to the VDL level so as to prevent the voltage from being excessively boosted. Alternatively, the overdrive write method may not be performed so that the output level of the write amplifier is set to the internal voltage VDL. However, when a write operation is performed using the internal voltage VDL, high-speed processing is adversely affected. At the beginning of a sensing operation by a sense amplifier, a high voltage (VEXT) is supplied to the sense amplifier. It takes long time for the sense amplifier operating with the high voltage (VEXT) to invert and write data at the internal voltage VDL, which is lower than the high voltage (VEXT). When a high-speed write operation needs to be performed at the internal voltage VDL, a power supply for a write circuit that has a large charge capacity is necessary. Thus, the power supply for a write circuit needs a large compensation capacitance, thereby adversely affecting a reduction in the chip size, and the power efficiency.

The problem will now be described in detail with reference to FIGS. 1 to 6. FIGS. 1 and 2 are a first schematic block diagram of a semiconductor memory device and a second schematic block diagram of another semiconductor memory device, respectively. FIG. 3 is a circuit diagram of a write amplifier (WAMP). FIG. 4 is a circuit diagram of a sense amplifier (SA) and a column selection switch (YSW). FIG. 5 is a circuit block diagram for illustrating a write operation. FIG. 6 is a timing chart of a write operation by a known overdrive write method.

In the semiconductor memory device shown in FIG. 1, memory cells are disposed in the form of a matrix in a memory cell array 1 surrounded by a word driver row (WD) 2 and a sense amplifier row (SA) 3. The sense amplifier row (SA) 3 includes a plurality of sense amplifiers. Each of the sense amplifiers is selected according to a column selection signal YSW. A selected sense amplifier is connected to a write amplifier (WAMP) and a data amplifier (DAMP) 6 (hereinafter called a write amplifier WAMP 6) via a pair of complementary IO data lines IO T and IO N. Hereinafter, a word driver row and a word driver are not distinguished, and both of them are called a word driver (WD) 2. A sense amplifier row and a sense amplifier are not distinguished, and both of them are called a sense amplifier (SA) 3.

The second schematic block diagram in FIG. 2 shows the other semiconductor memory device that includes a plurality of memory cell arrays. When a plurality of blocks of memory cell arrays exist, data lines are stratified and connected to the write amplifier WAMP 6. A pair of bit lines BIT T and BIT N in a memory cell array is selected by a column selection switch YSW and connected to a pair of complementary IO data lines IO T and IO N. Moreover, the pair of the complementary IO data lines IO T and IO N is selected by an IO selection switch 5 and connected to the write amplifier WAMP 6. A current semiconductor memory devices includes a plurality of memory cell arrays, and the data lines are stratified. However, the essence of the present invention does not relate to the stratification of data. Thus, in the following description, the schematic block diagram in FIG. 1 is used.

In the write amplifier (WAMP) 6 in FIG. 3, when a write enable signal WAE is at the high level, data in a read write bus RWBS is output to a pair of complementary IO data lines IO T and IO N. The power supply voltage of an output driver of the write circuit is VRW, and the high and low levels of data are VRW and GND. In a general overdrive write method, VRW is an external power supply voltage VEXT supplied from an external source. It does not matter whether the data in the read write bus RWBS is complementary data.

Write data from the write amplifier WAMP 6 is transferred to the pair of the complementary IO data lines IO T and IO N, as shown in FIG. 4. Moreover, the write data is transferred to a pair of bit lines BIT T and BIT N via a column selection switch YSW 4 and written to the sense amplifier (SA) 3 and a selected memory cell. The sense amplifier (SA) 3 is a flip-flop circuit that includes two inverter circuits and is connected to the pair of the bit lines BIT T and BIT N. A high power supply voltage (SAP)/a low power supply voltage (SAN) is supplied to the sense amplifier (SA) 3. As the power supply of the sense amplifier (SA) 3, the external power supply voltage VEXT/ the ground voltage GND is supplied during an overdrive period at the beginning of a sensing operation, and an internal voltage VDL/an internal voltage VSL is supplied during a regular operation period. When the sense amplifier (SA) 3 is not activated, the power supply voltages are not supplied.

The column selection switch YSW 4 includes an N-channel transistor and is selected according to the selection signal YSW and brought into conduction. When the column selection switch YSW 4 is brought into conduction, data in the pair of the complementary IO data lines IO T and IO N is transferred to the pair of the bit lines BIT T and BIT N, respectively. The data levels from the pair of the complementary IO data lines IO T and IO N are the high level VRW and the low level GND, which are the signal levels of an output stage of the write amplifier WAMP 6.

The problem with successive write operations will now be described with reference to FIGS. 5 and 6. The write amplifier WAMP 6 outputs write data to the complementary IO data lines IO T and IO N. In the case of the overdrive write method, the power supply voltage VEXT is supplied as the power supply VRW of the write amplifier WAMP 6. A sense amplifier power circuit 7 generates the power supply voltage SAP/ the power supply voltage SAN of the sense amplifier (SA) 3. The power supply voltage VEXT is supplied from an external source. The internal voltage VDL is an array voltage and is lower than the power supply voltage VEXT. The sense amplifier power circuit 7 supplies the power supply voltage to the common source power supply SAP/SAN of the sense amplifier (SA) 3 according to a sense amplifier enable signal SE.

A path exists for supplying the power supply voltage VEXT to the common source power supply SAP of a high voltage according to a sense overdrive signal (ODV or ODV2) during an overdrive period at the beginning of a sensing operation. A small voltage difference from the charge from a memory cell is sensed at the beginning of a sensing operation. In this case, in order to turn on a P-channel transistor in the sense amplifier (SA) 3, a high voltage is necessary as the high voltage power supply SAP. The high voltage exceeds a threshold voltage Vt of the P-channel transistor from the reference level of the internal voltage VDL/2. The high voltage power supply SAP is overdriven to be set to the power supply voltage VEXT to obtain the high voltage. After row address strobe (RAS) to column address strobe (CAS) delay (tRCD) LONG, i.e., after sufficient time has elapsed since the beginning of a sensing operation, amplification in the bit lines BIT T and BIT N by the sense amplifier (SA) 3 is almost completed, and the high voltage power supply SAP is again set to the VDL level, which is a predetermined voltage.

Various types of overdrive method exist for boosting the high voltage power supply SAP. For example, a type of overdrive method exists, in which the power supply voltage VEXT is connected to the sense amplifier power circuit 7 in FIG. 5 according to a sense overdrive signal (ODV2), as indicated by a dotted line. Moreover, another type of overdrive method exists, in which a node VDL of a VDL power circuit is overcharged according to a sense overdrive signal (ODV), and the voltage is supplied as the high voltage power supply SAP according to the sense enable signal SE. In the description of the present invention, the other type of overdrive method is used, in which an overcharge operation is performed. The write amplifier WAMP 6 has the circuitry shown in FIG. 4, and the power supply voltage VRW of the output driver is the power supply voltage VEXT supplied from an external source. Thus, the high and low levels of write data are VEXT and GND.

FIG. 6 shows the waveforms of successive write operations in the case of the tRCD LONG. FIG. 6 shows the waveforms of a word line WL, the sense overdrive signal ODV, the sense enable signal SE, a write enable signal WAE, column selection switches YSW, the node VDL, and the pair of the bit lines BIT T and BIT N. The node VDL is a node of the sense amplifier power circuit 7, which generates a voltage to be supplied to the high voltage common source SAP of the sense amplifier (SA) 3. When a selected word line is activated, a small voltage difference in a memory cell is detected in the pair of the bit lines that are precharged to the reference level VDL/2. The node VDL is overcharged according to the overcharge signal ODV.

A voltage is applied to the common source of the sense amplifier (SA) 3 according to the sense enable signal SE. At the beginning of a sensing operation, an overdrive operation is performed so that the power supply voltage VEXT is applied to the high voltage power supply SAP. The power supply voltage VEXT is higher than the internal voltage VDL. Thus, a sensing operation is performed quickly. FIG. 6 shows parts (indicated by full lines) of the pair of the bit lines BIT T and BIT N near the sense amplifier (SA) 3 and other parts (indicated by dot lines) of the pair of the bit lines BIT T and BIT N far from the sense amplifier (SA) 3. When amplification is almost completed in the parts of the pair of the bit lines BIT T and BIT N near the sense amplifier (SA) 3, the voltages of the node VDL and the high voltage power supply SAP are again set to the internal voltage VDL. Then, amplification is completed in the other parts of the pair of the bit lines BIT T and BIT N far from the sense amplifier (SA) 3.

Then, when the write enable signal WAE is activated, successive write operations are performed by the overdrive write method. The voltage VRW (in this case, VEXT), which is higher than the internal voltage VDL, and the ground voltage GND are respectively output as the high and low levels of write data from the write amplifier WAMP 6. When one of the column selection switches YSW selected according to the column selection signal is brought into conduction, write operations are performed on the sense amplifier (SA) 3, the pair of the bit lines BIT T and BIT N, and the memory cell. In this case, since the high level of the column selection signal is also the power supply voltage VEXT, a voltage of VEXT−Vtn is applied to a bit line. The voltage in the bit line is excessively boosted from the internal voltage VDL to VEXT−Vtn.

Since no path exists for discharging the charge, the more times successive write operations are performed, the more excessively the voltage in the bit line is boosted. The high voltage power supply SAP of the sense amplifier (SA) 3 is also boosted. In this way, the voltage in the bit line and the high voltage power supply SAP of the sense amplifier (SA) 3 are boosted from the internal voltage VDL to VEXT−Vtn. In FIG. 6, when the column selection switches YSW are sequentially selected and when the number of times successive write operation are performed increases, the voltage is boosted. When successive write operations are performed n times, the voltage is boosted to VEXT−Vtn. In this way, the bit line voltage is excessively boosted, so that the voltage in one of the complementary bit lines is boosted to VEXT−Vtn.

In a status in which the voltage in one of the complementary bit lines is boosted to VEXT−Vtn, write operations are completed, and a precharge operation is performed. However, since a precharge circuit does not include any path for discharging the charge, the voltage is excessively boosted to a voltage level that is equal to or more than the internal voltage VDL. In this status, in a precharge operation in which complementary bit lines are shorted, the reference level is set to a voltage level that is equal to or more than VDL/2. Thus, a correct reference level (VDL/2) cannot be obtained. When the voltage is not precharged to the correct level, the operation of the sense amplifier (SA) 3 becomes unstable, and this may cause an erroneous read operation. In order to obtain the correct precharge level, the voltage of a boosted bit line needs to be decreased to the VDL level to prevent the voltage in the bit line from being excessively boosted.

In FIG. 6, the waveforms of successive write operations in the case of the tRCD LONG are described. The tRCD LONG includes the tRCD plus a margin. Write operations may be performed after the tRCD LONG or tRCD MINIMUM.

(1) At the time when write operations are performed after the tRCD MINIMUM, the sense amplifier (SA) 3 is activated, and amplification is being performed in the other parts of the pair of the bit lines BIT T and BIT N far from the sense amplifier (SA) 3.

(2) At the time when write operations are performed after the tRCD LONG, sufficient time has elapsed since the sense amplifier (SA) 3 was activated. Thus, the voltage difference in the other parts of the pair of the bit lines BIT T and BIT N far from the sense amplifier (SA) 3 is also sufficient.

(1) Even in the case of the tRCD MINIMUM, the sense amplifier (SA) 3 is overdriven to reduce the tRCD. Since a voltage that is equal to or more than the internal voltage VDL is applied to the sense amplifier (SA) 3, the level that needs to be inverted by the write amplifier WAMP 6 is higher than the internal voltage VDL. Thus, in a write operation with the internal voltage VDL, it may be the case that the write amplifier WAMP 6 cannot invert the bit lines BIT T and BIT N sufficiently, which are amplified by the sense amplifier (SA) 3 operating in an overdrive mode, to write data. In this case, after a corresponding column selection switch YSW is closed, the voltage difference in the bit lines BIT T and BIT N in the sense amplifier (SA) 3 is not sufficient. Thus, subsequently, a delay occurs in the sense amplifier (SA) 3 (in a restore operation) and amplification in the bit lines BIT T and BIT N. Accordingly, a write operation by the overdrive method needs to be performed by the write amplifier WAMP 6. In the overdrive write method using the power supply voltage VEXT, a problem exists in that the bit line voltage is excessively boosted, as described above.

(2) In the case of the tRCD LONG, the operation is as described above. During the tRCD plus a margin, the write amplifier WAMP 6 is overdriven to quickly invert the bit lines BIT T and BIT N sufficiently amplified by the sense amplifier (SA) 3 to write data. In this way, when a write operation is performed after either the tRCD LONG or the tRCD MINIMUM, the write amplifier WAMP 6 is overdriven to achieve high-speed processing. However, in the overdrive write method using the power supply voltage VEXT, a problem exists in that the bit line voltage is excessively boosted.

In this way, in the overdrive write method using the power supply voltage VEXT, a problem exists in that the bit line voltage is excessively boosted when successive write operations are performed. Moreover, another problem exists in that, when the bit line voltage is excessively boosted, a correct reference level cannot be obtained in a precharge operation, thereby causing an erroneous operation of the sense amplifier (SA) 3. In International Publication No. WO97/24729 and Japanese Unexamined Patent Application Publication No. 10-255470, the problem that the bit line voltage is excessively boosted, which was found by the inventor, is not described and not recognized. Thus, no technique for solving the problem is suggested.

When successive write operations are repeated on the same word line, an overdrive operation is repeated on bit lines in which a sufficient voltage difference is generated by performing amplification. Thus, a problem exists in that the bit line voltage is excessively boosted. When the bit line voltage is excessively boosted, the voltage in one of the complementary bit lines is excessively boosted to a voltage that is equal to or more than the internal voltage VDL. In this status, after a precharge operation in which the complementary bit lines are shorted, a correct reference level cannot be obtained. Thus, a problem exists in that an erroneous operation of the sense amplifier may occur.

SUMMARY OF THE INVENTION

In view of the aforementioned problems, it is an object of the present invention to establish a method for preventing the voltage in a bit line from being excessively boosted. The present invention provides an overdrive write method, a write amplifier power generating circuit, which prevent the voltage in a bit line from being excessively boosted by performing control so that the achieved voltage in the bit line is not boosted to a level that is higher than an internal voltage VDL when data is written by the overdrive write method, and a semiconductor memory device including the same.

To solve the aforementioned problems, in the present invention, techniques that are described below are adopted. Needless to say, applied techniques that are obtained by changing the techniques without departing from the gist of the techniques are covered by the present invention.

A semiconductor memory device according to a first aspect of the present invention includes a write amplifier power generating circuit that supplies, as a power supply voltage of a write amplifier, a first voltage in a first write cycle in which a write overdrive signal is activated and a second voltage in a second write cycle in which the write overdrive signal is deactivated.

The second voltage may be a high level voltage to be written to a memory cell, and the first voltage may be higher than the second voltage.

The write overdrive signal may be activated by activating a write enable signal and deactivated by the time amplification in a pair of bit lines that are amplified according to data stored in a memory cell is completed.

The write overdrive signal may be activated by activating a sense overdrive signal and a write enable signal and deactivated by deactivating the sense overdrive signal.

The write overdrive signal may be activated by activating a RAS-TIME-OUT signal and a write enable signal and deactivated by deactivating the RAS-TIME-OUT signal.

The write amplifier power generating circuit may include current mirror transistors, differential input transistors to which a reference voltage and an output voltage are individually input, and a driver transistor, and voltages of gates of the current mirror transistors and the driver transistor may be controlled.

The write amplifier power generating circuit may further include a regulator transistor connected in parallel with one of the differential input transistors to which the reference voltage is input, and a second reference voltage may be input to a gate of the regulator transistor.

The write amplifier power generating circuit may further include a connection control transistor connected in series with the regulator transistor, and a connection control signal may be input to a gate of the connection control transistor.

An overdrive write method according to a second aspect of the present invention is provided, in which, in individual write cycles, a write high level from a write amplifier is changed depending on a status of a pair of bit lines that are amplified according to data stored in a memory cell.

The write high level may be set to a first voltage in a first write cycle in which the pair of the bit lines are being amplified and may be set to a second voltage in a second write cycle after amplification in the pair of the bit lines has been completed.

The second voltage may be a high level voltage to be written to a memory cell, and the first voltage may be higher than the second voltage.

Switching from the first write cycle to the second write cycle may be performed in synchronization with deactivation of a sense overdrive signal.

Switching from the first write cycle to the second write cycle may be performed according to a RAS-TIME-OUT signal.

A semiconductor memory device according to a third aspect of the present invention is provided, which performs a write operation by any one of the aforementioned overdrive write methods.

In the present invention, successive write operations are performed by an overdrive write method in which a high level from a write amplifier is set to a first voltage (for example, an external power supply voltage) in a status in which a pair of bit lines are being amplified according to data stored in a memory cell, and are performed by a write method in which the high level from the write amplifier is set to a second voltage (for example, an internal voltage VDL) in a status in which amplification in the pair of the bit lines has been completed. Thus, the voltage in a bit line can be prevented from being excessively boosted.

DESCRIPTION OF THE PREFERRED EMBODIMENTS

Figure 1:
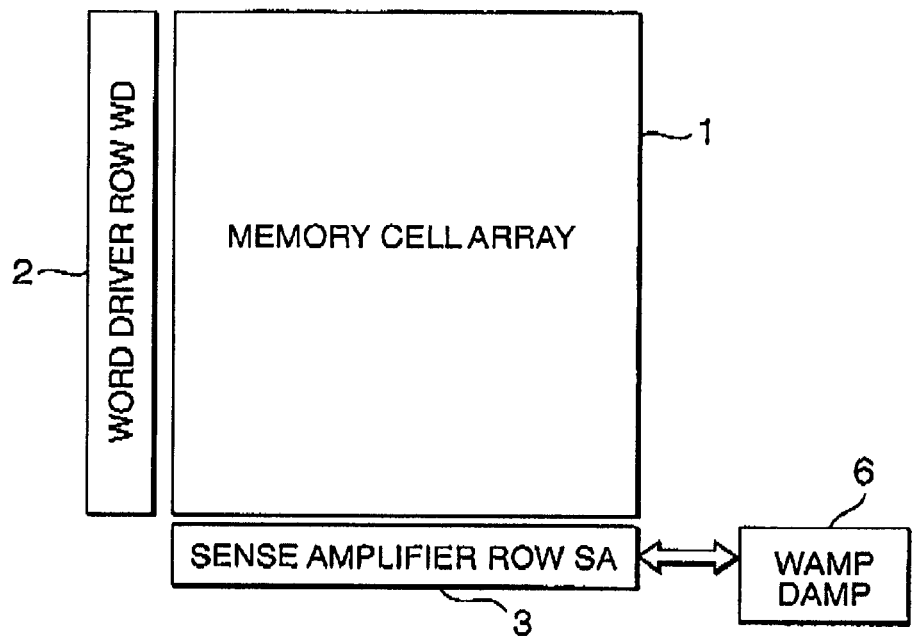
FIG. 1 is a first schematic block diagram of a semiconductor memory device.
Figure 2:
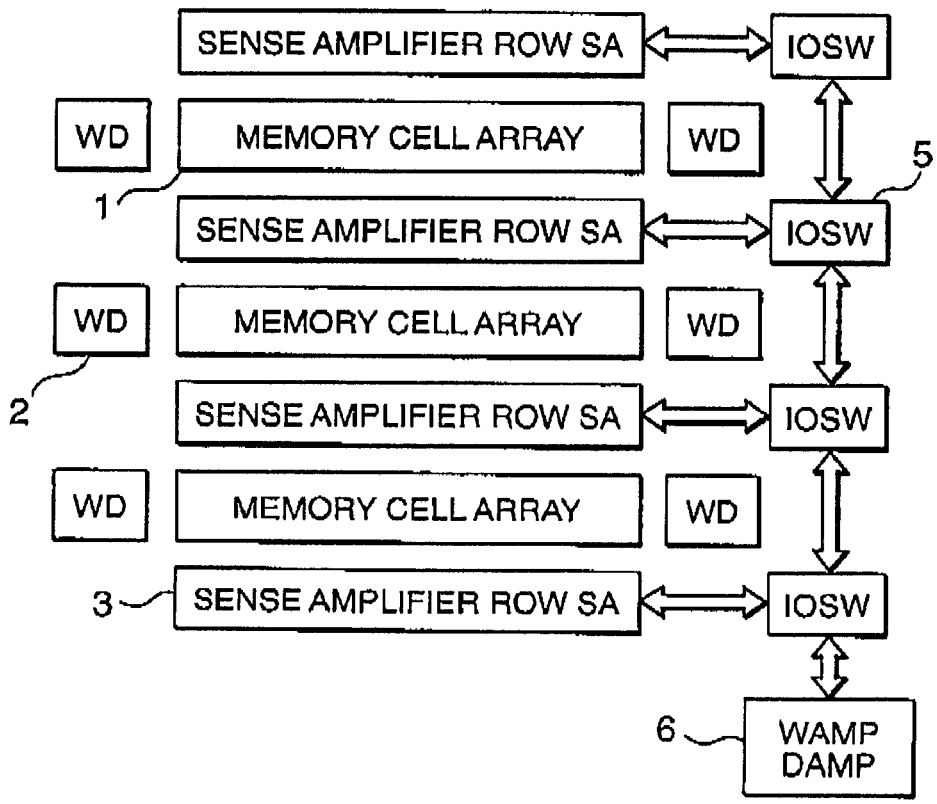
FIG. 2 is a second schematic block diagram of another semiconductor memory device.
Figure 3:
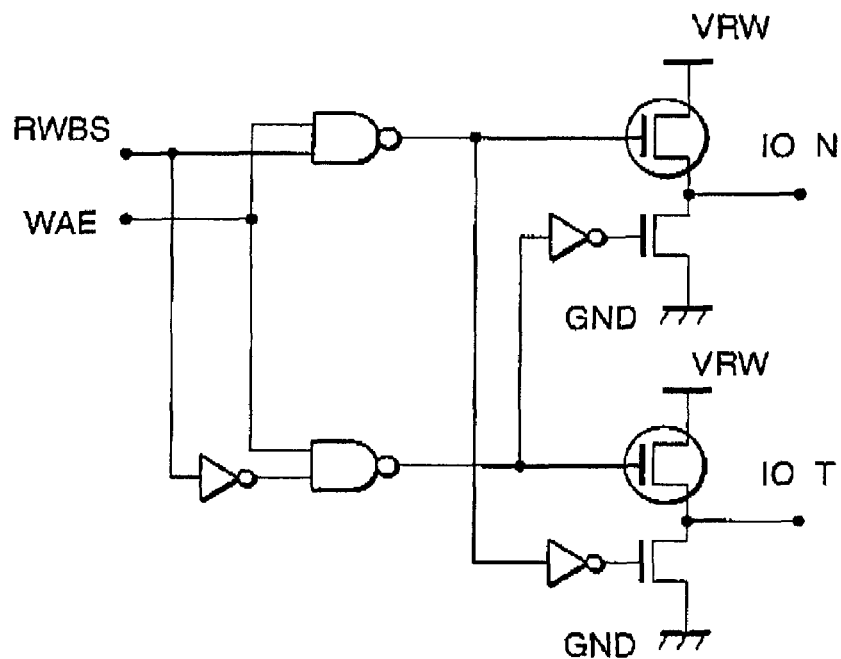
FIG. 3 is a circuit diagram of a write amplifier.
Figure 4:
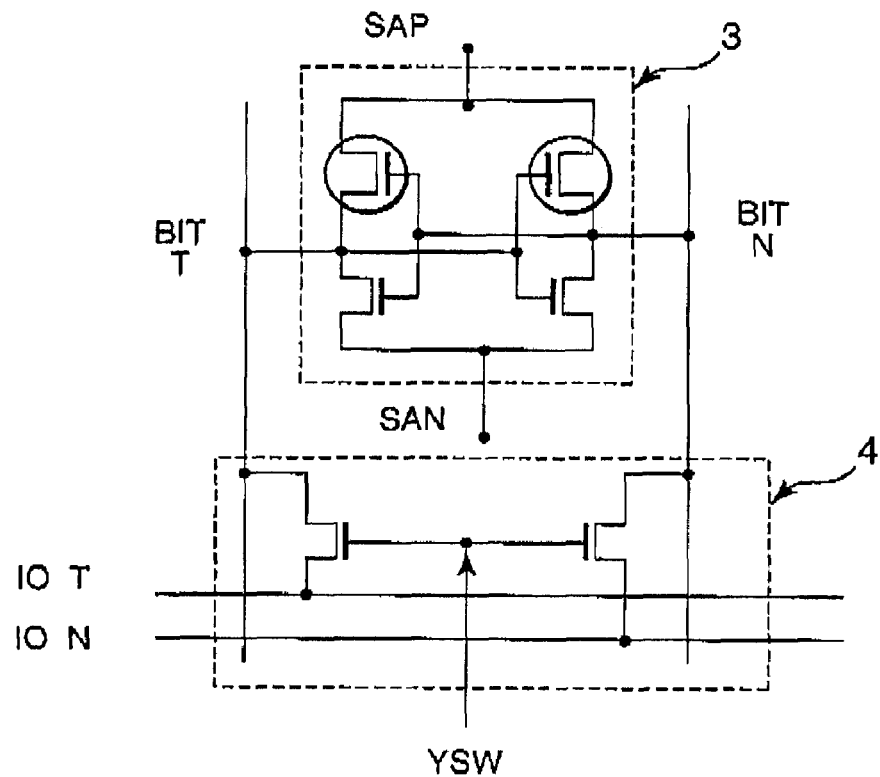
FIG. 4 is a circuit diagram of a sense amplifier and a column selection switch.
Figure 5:
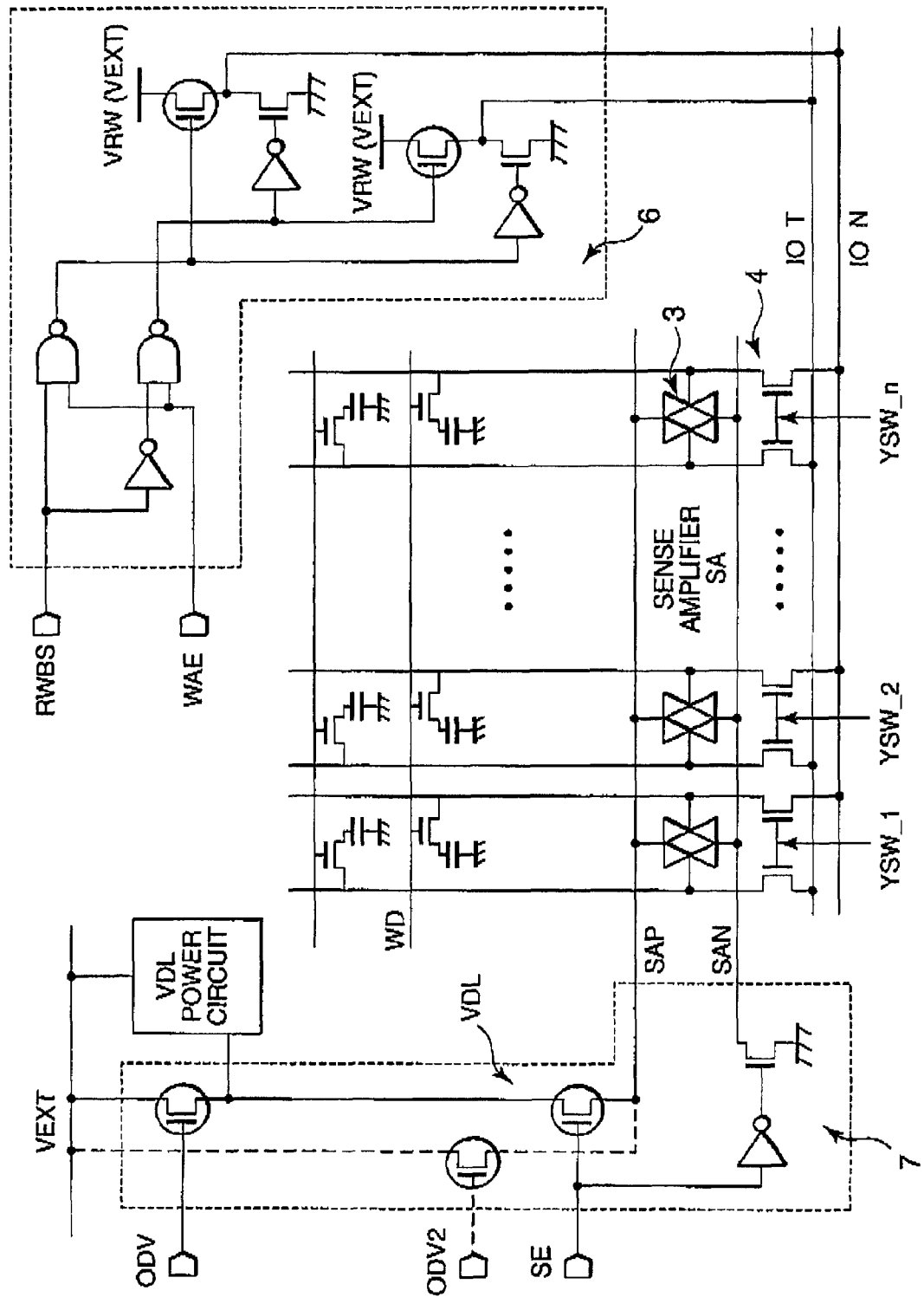
FIG. 5 is a schematic circuit block diagram for illustrating a write operation.
Figure 6:
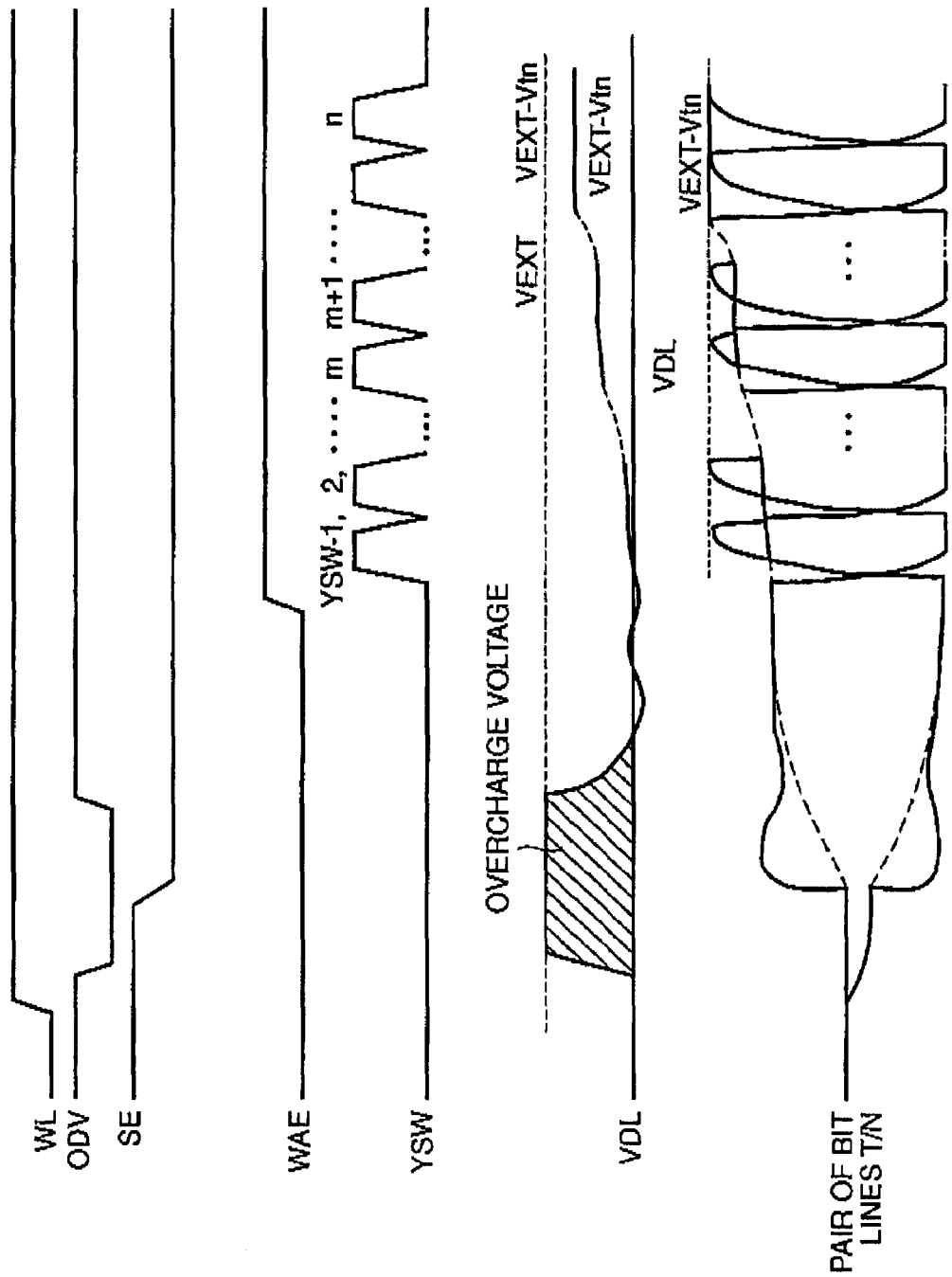
FIG. 6 is a waveform chart of a write operation by a known write method.
Figure 7:
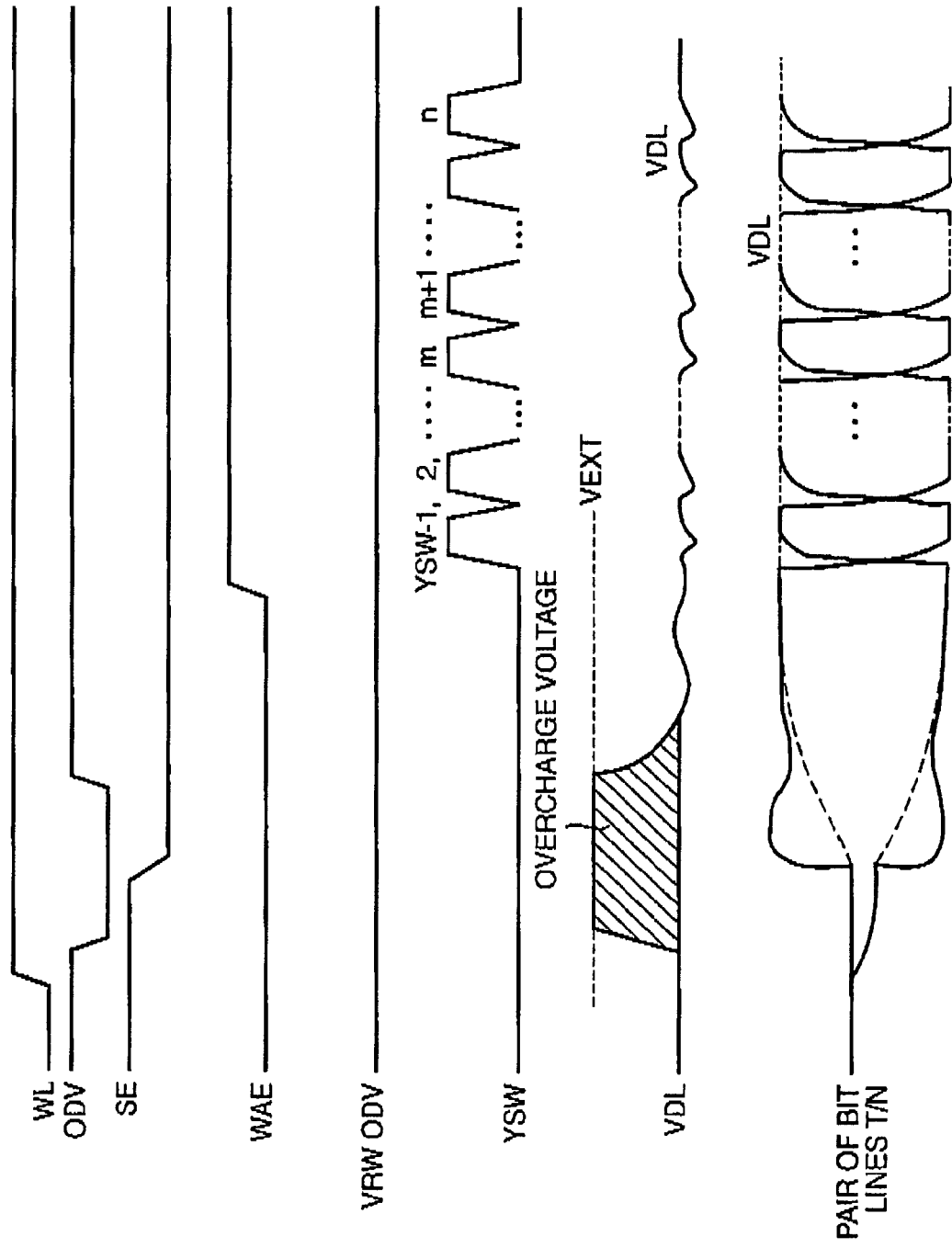
FIG. 7 is a waveform chart showing the waveforms of write operations in the case of the tRCD LONG in the present invention.
Figure 8:
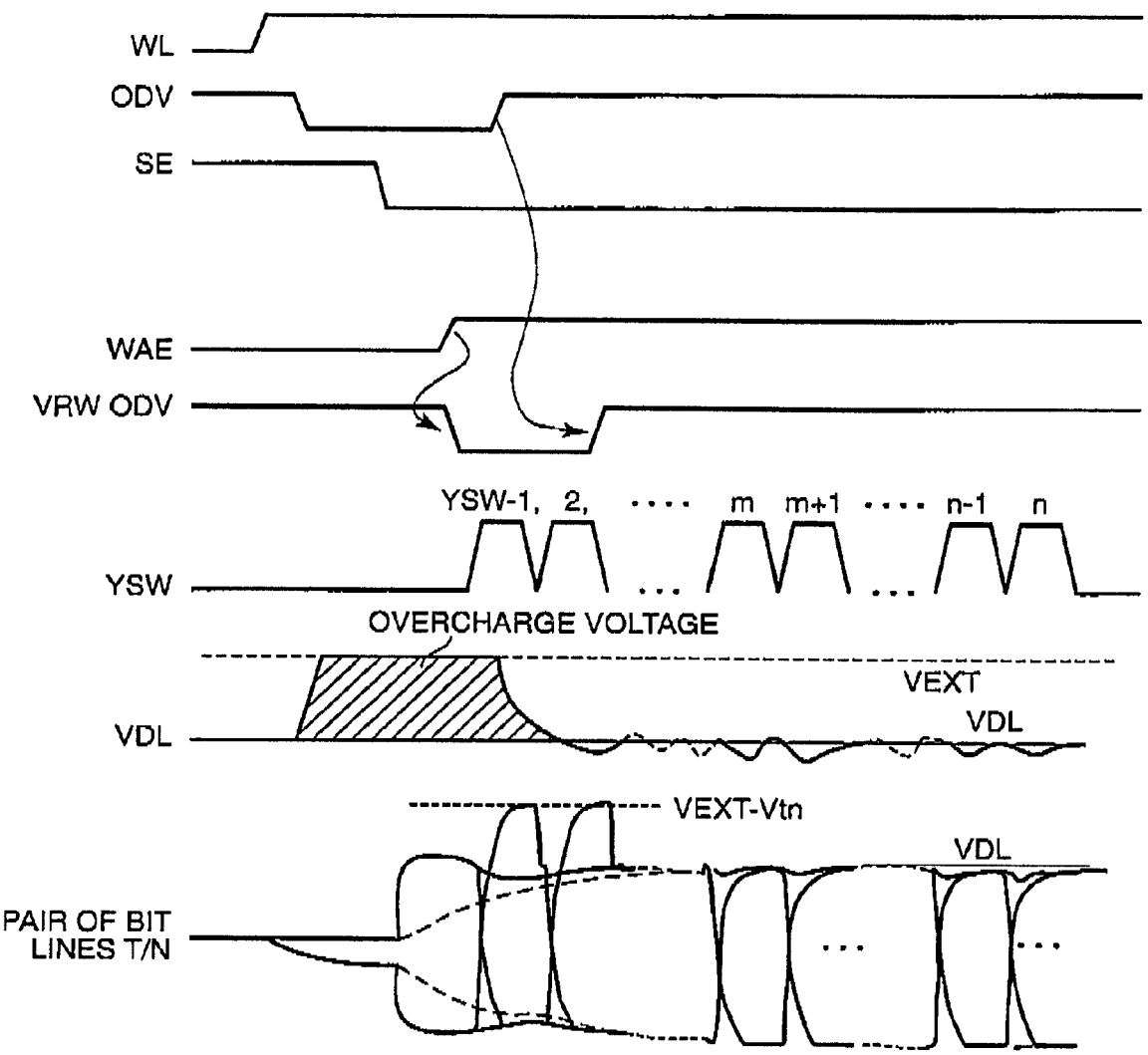
FIG. 8 is a waveform chart showing the waveforms of write operations in the case of the tRCD MINIMUM in the present invention.
Figure 9:
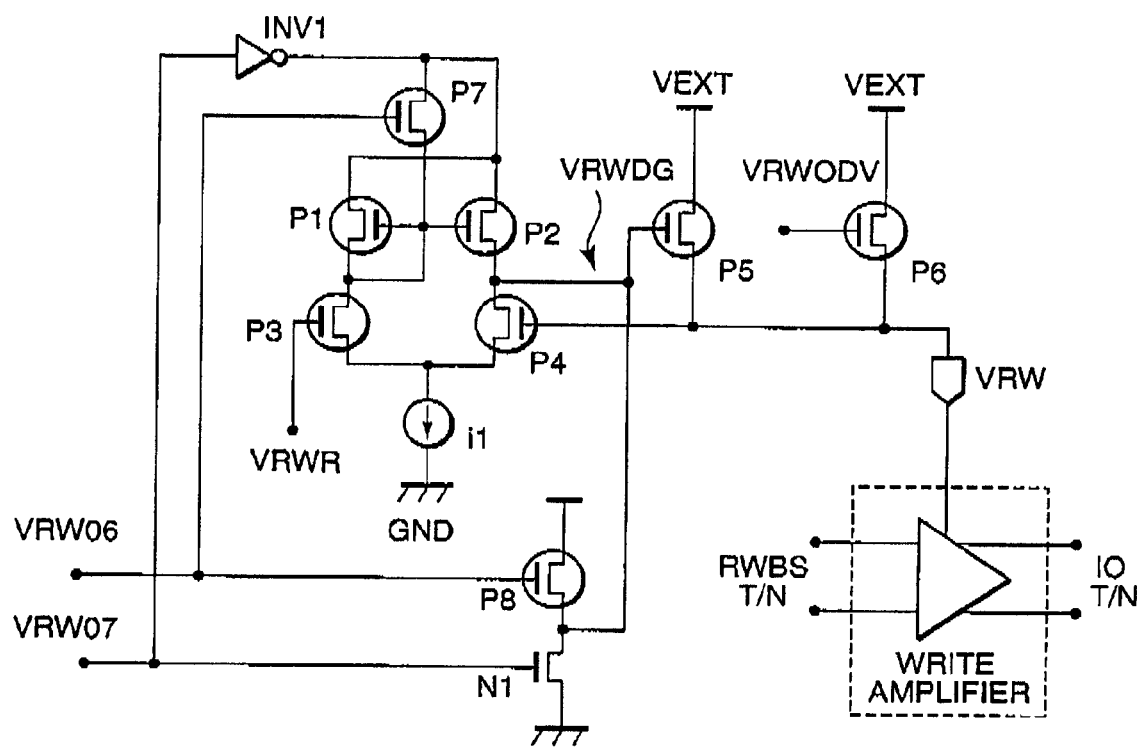
FIG. 9 is a circuit diagram of a write amplifier power generating circuit according to a first embodiment of the present invention.
Figure 10:
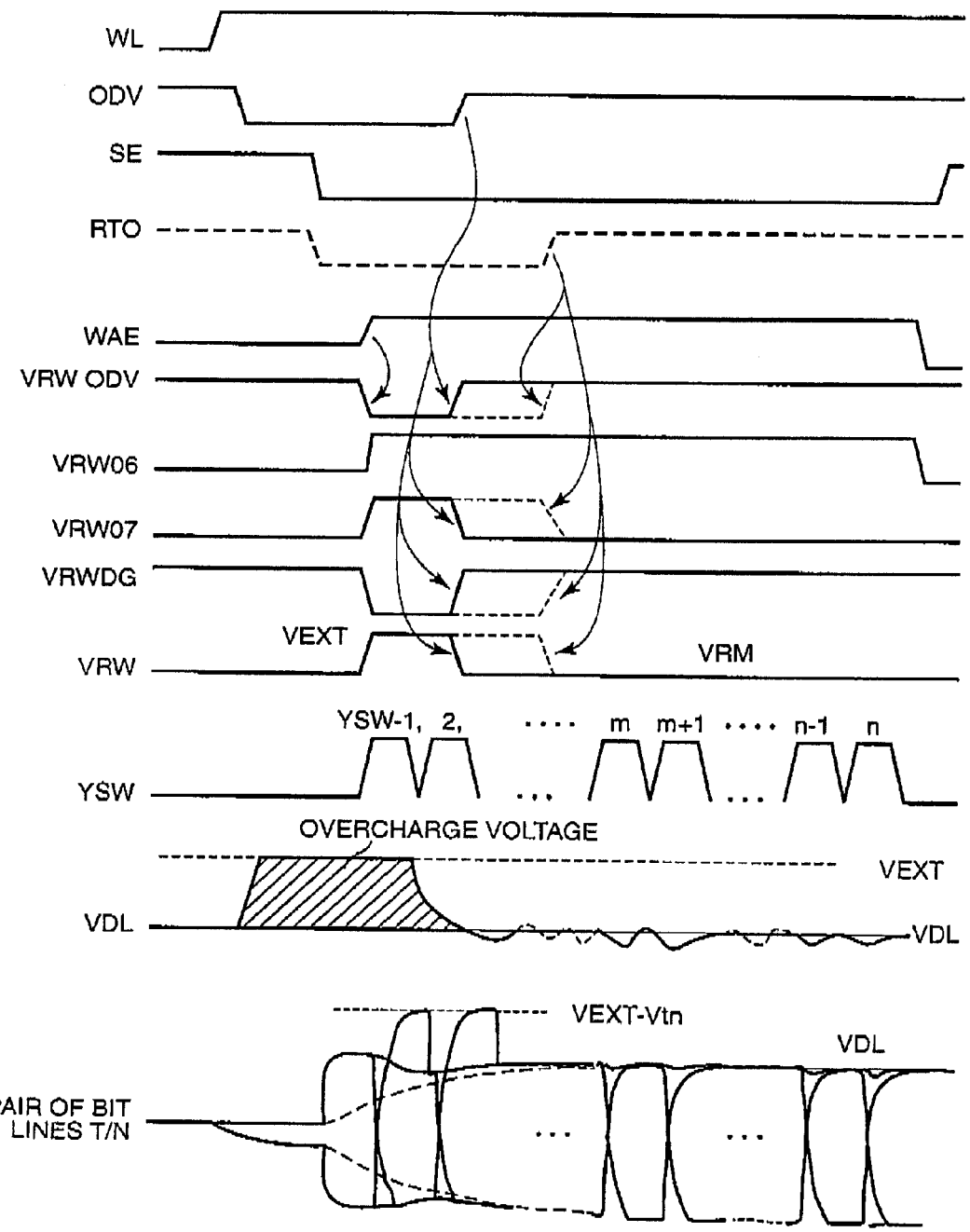
FIG. 10 is a waveform chart showing the waveforms of write operations in which the write amplifier power generating circuit shown in FIG. 9 is used.
Figure 11:
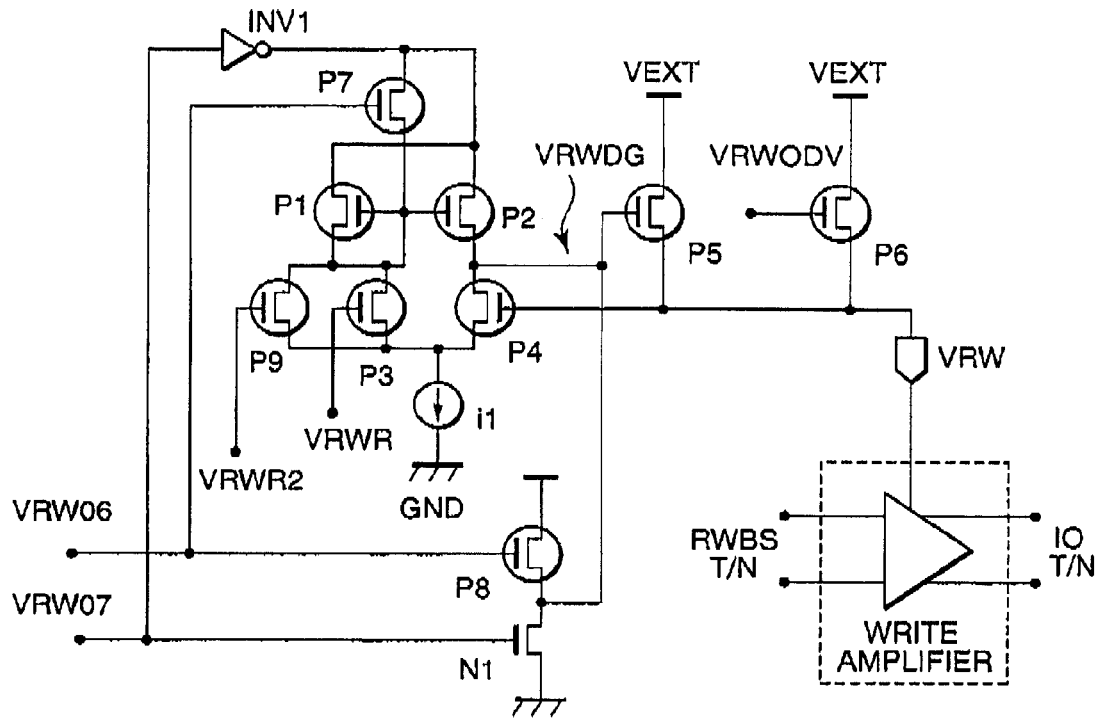
FIG. 11 is a circuit diagram of a write amplifier power generating circuit according to a second embodiment.
Figure 12:
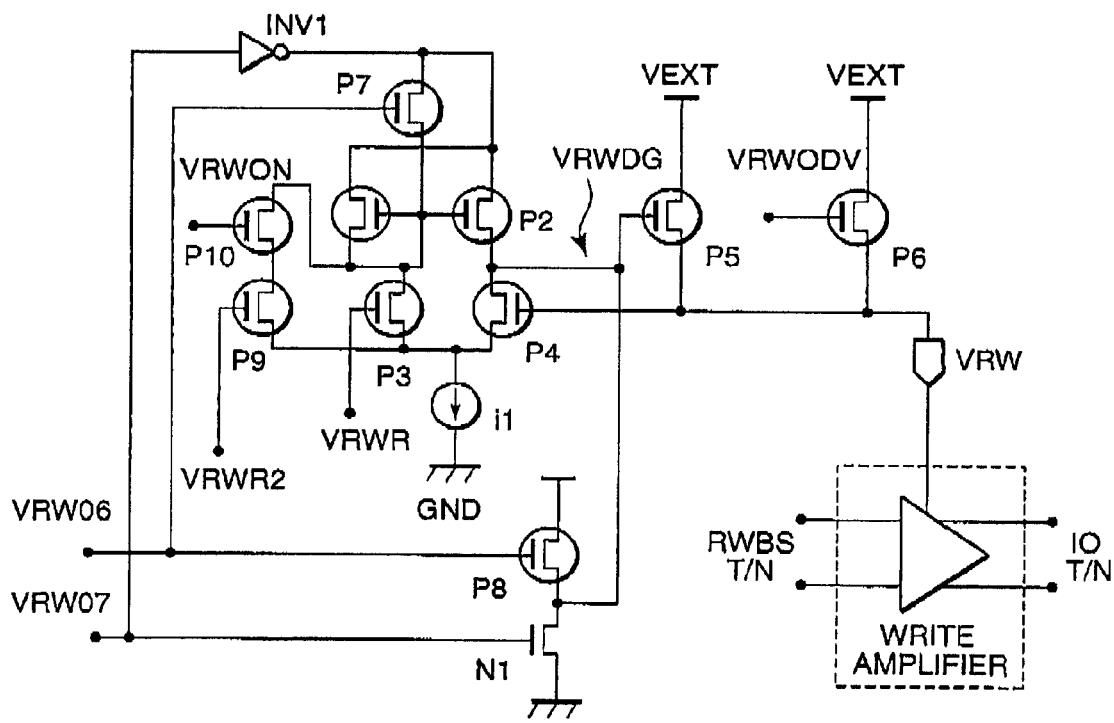
FIG. 12 is a circuit diagram of a write amplifier power generating circuit according to a third embodiment.
Figure 13:
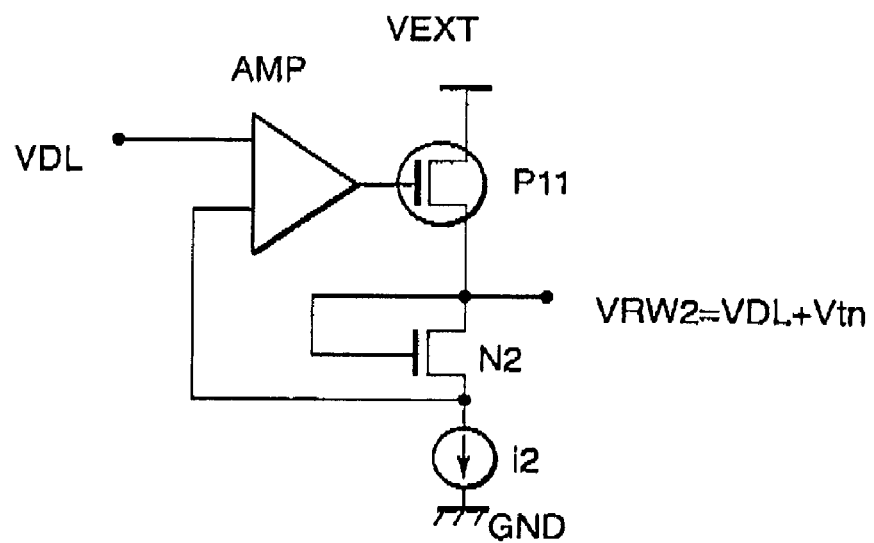
FIG. 13 is a circuit diagram of a first reference voltage generating circuit.
Figure 14:
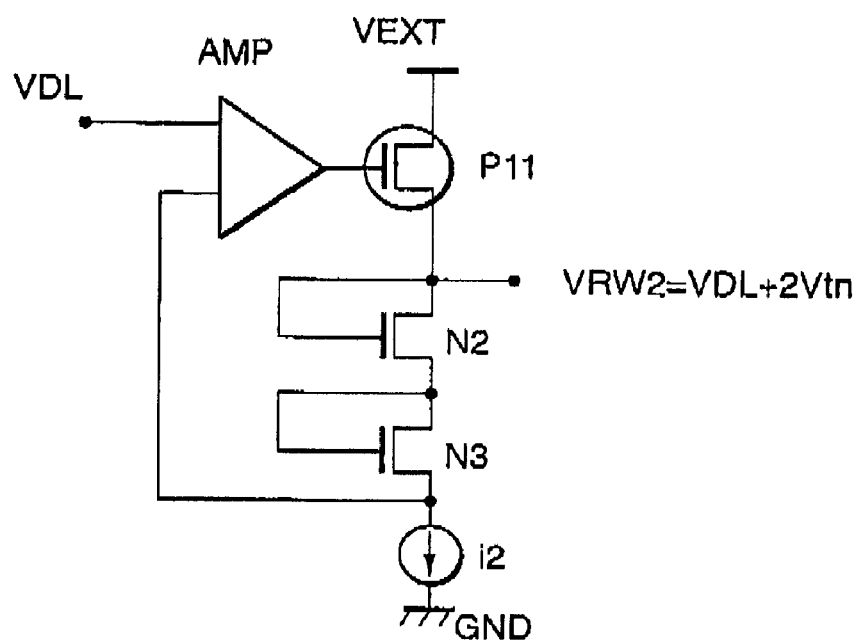
FIG. 14 is a circuit diagram of a second reference voltage generating circuit.

Embodiments according to the present invention will now be described with reference to FIGS. 7 to 14. FIG. 7 is a waveform chart showing the waveforms of write operations in the case of the tRCD LONG in the present invention. FIG. 8 is a waveform chart showing the waveforms of write operations in the case of the tRCD MINIMUM. FIG. 9 is a circuit diagram of a write amplifier power generating circuit according to a first embodiment. FIG. 10 is a waveform chart showing the waveforms of write operations in which the write amplifier power generating circuit shown in FIG. 9 is used. FIG. 11 is a circuit diagram of a write amplifier power generating circuit according to a second embodiment. FIG. 12 is a circuit diagram of a write amplifier power generating circuit according to a third embodiment. FIG. 13 is a circuit diagram of a first reference voltage generating circuit. FIG. 14 is a circuit diagram of a second reference voltage generating circuit.

A semiconductor memory device according to the present invention includes a write amplifier power generating circuit for controlling a power supply voltage of a write amplifier WAMP. The high level of write data is controlled so as to prevent the voltage in a bit line from being excessively boosted. The outline block configuration and configurations of a sense amplifier SA, column selection switches, and a write amplifier of the semiconductor memory device according to the present invention are the same as those of a known semiconductor memory device (FIGS. 1 to 5), and the description is omitted here. The present invention is characterized in that the write amplifier power generating circuit is provided, which supplies an optimal power supply voltage as a power supply voltage VRW of the write amplifier.

In FIGS. 7 and 8, the waveforms of the following items in write operations are shown: a word line WL, a sense overdrive signal ODV, a sense enable signal SE, a write enable signal WAE, a write overdrive signal VRW ODV, column selection switches YSW, a node VDL of a sense amplifier power circuit, and a pair of bit lines BIT T and BIT N. Regarding the pair of the bit lines BIT T and BIT N, full lines indicate parts of the pair of the bit lines BIT T and BIT N near the sense amplifier, and dot lines indicate other parts of the pair of the bit lines BIT T and BIT N far from the sense amplifier. In the case of the tRCD LONG shown in FIG. 7, write operations by the overdrive method are not performed. On the other hand, in the case of the tRCD MINIMUM shown in FIG. 8, write operations by the overdrive method are performed.

After the tRCD LONG shown in FIG. 7, a period during which the sense amplifier circuit is overdriven ends, the sense amplifier and the bit lines BIT T and BIT N including the parts near and far from the sense amplifier are sufficiently amplified, and the voltage is stable at an internal voltage VDL. Thus, when write operations are performed after the tRCD LONG, the write overdrive signal VRW ODV is not activated, and thus overdrive from the write amplifier is not performed. The write overdrive signal VRW ODV is activated when both of the sense overdrive signal ODV and the write enable signal WAE are activated.

When the selected word line WL is activated, a small voltage difference occurs in the pair of the bit lines BIT T and BIT N. Moreover, the node VDL of the sense amplifier power circuit is charged to an external power supply voltage VEXT according to the sense overdrive signal ODV. When the sense amplifier enable signal SE is activated, the sense amplifier starts to perform amplification, so that the pair of the bit lines BIT T and BIT N is quickly amplified. When the parts (full lines) of the pair of the bit lines BIT T and BIT N near the sense amplifier have been amplified sufficiently, the sense overdrive signal ODV is deactivated, so that the internal voltage VDL is supplied from the sense amplifier power circuit as a high voltage power supply SAP of the sense amplifier. The internal voltage VDL is a power supply voltage for an internal circuit to which the power supply voltage VEXT from an external source is stepped down, and is used as a write voltage to a memory cell.

After the tRCD LONG, a sufficient voltage difference is achieved in the other parts (dotted lines) of the bit lines BIT T and BIT N far from the sense amplifier. In this status, the write enable signal WAE and the column selection switches YSW are activated, so that the write voltage VRW is input from the write amplifier. The write overdrive signal VRW ODV is to be activated by the write enable signal WAE. However, since the sense overdrive signal ODV is deactivated, the write overdrive signal VRW ODV is not activated. Thus, in this case, the write voltage VRW is set to the internal voltage VDL.

In this way, after the tRCD LONG, an overdrive period at the beginning of a sensing operation ends, and the high voltage power supply SAP of the pair of the bit lines BIT T and BIT N and the sense amplifier is stable at the internal voltage VDL, so that write operations are performed with the write voltage VDL. The column selection switches YSW are sequentially selected, and successive write operations are performed, so that the internal voltage VDL is written to the sense amplifier, the bit lines BIT T and BIT N, and the memory cell. However, even when successive write operations are performed, the voltage in a bit line is not excessively boosted because the write voltage is the internal voltage VDL.

On the other hand, in the case of the tRCD MINIMUM, write operations are started in a period during which the sense amplifier circuit is overdriven. Thus, in write operations in the case of the tRCOD MINIMUM, the write overdrive signal VRW ODV is activated, so that overdrive from the write amplifier is performed. When the write overdrive signal VRW ODV is deactivated, write operations are performed with the internal voltage VDL.

When the selected word line WL is activated, a small voltage difference occurs in the pair of the bit lines BIT T and BIT N. Moreover, the node VDL of the sense amplifier power circuit is charged to the power supply voltage VEXT according to the sense overdrive signal ODV. When the sense amplifier enable signal SE is activated, the sense amplifier starts to perform amplification, so that the pair of the bit lines BIT T and BIT N is quickly amplified. In the case of the tRCD MINIMUM, at this time, the write enable signal WAE and the column selection switches YSW are activated, so that write operations start. The write voltage VRW is input from the write amplifier. The write overdrive signal VRW ODV is also activated by the write enable signal WAE. Thus, the write voltage VRW is set to the write overdrive voltage VEXT. The write voltage VEXT of a high level from the write amplifier is input, so that a write voltage VEXT−Vtn is input to the pair of the bit lines BIT T and BIT N and the sense amplifier.

When the parts (full lines) of the pair of the bit lines BIT T and BIT N near the sense amplifier have been amplified sufficiently, the sense overdrive signal ODV is deactivated, so that the voltage VDL is supplied from the sense amplifier power circuit as the high voltage power supply SAP of the sense amplifier. Moreover, the write overdrive signal VRW ODV is deactivated, so that the write voltage VRW is set to the internal voltage VDL. In this way, in the case of the tRCD MINIMUM, in a first write cycle during an overdrive period at the beginning of a sensing operation, write operations are performed with an overdrive voltage, and in a second write cycle after sense overdrive is completed, write operations are performed with the internal voltage VDL.

The column selection switches YSW are sequentially selected, and successive write operations are performed. During a sense overdrive period, since an overdrive voltage that is higher than the internal voltage VDL is supplied to the sense amplifier, write operations are performed with the overdrive voltage. The overdrive voltage is supplied from the sense amplifier and the write amplifier. However, at this time, since the other parts of the pair of the bit lines BIT T and BIT N far from the sense amplifier are being amplified, the charge is used to amplify the other parts of the pair of the bit lines BIT T and BIT N far from the sense amplifier. Thus, the voltage in a bit line is not excessively boosted. After sense overdrive is completed, write operations are performed with the internal voltage VDL. Thus, although successive write operations are performed, since the write voltage is the internal voltage VDL, the voltage in a bit line is not excessively boosted. In this way, the high level voltage of write data is changed depending on the type of write cycle.

FIG. 9 shows a write amplifier power generating circuit according to a first embodiment of the present invention. A write amplifier power generating circuit 8 is based on a current mirror differential amplifier. The write amplifier power generating circuit 8 includes a current mirror circuit, a driver transistor P5, a write overdrive transistor P6, and an additional logical circuit. The source of a mirror transistor P1 is connected to the output of an inverter circuit INV1, and the gate is connected to the drain of the transistor P1 and the gate of a mirror transistor P2. The source of the transistor P2 is connected to the output of the inverter circuit INV1, the gate is connected to the gate of the transistor P1, and the drain is connected to a control node VRWDG. The source of a differential transistor P3 is connected to the drain of the transistor P1, the gate is connected to a reference voltage VRWR, and the drain is connected to a current source i1.

The source of a differential transistor P4 that forms a pair on the feedback side is connected to the control node VRWDG, the gate is connected to an output node VRW, and the drain is connected to the current source i1. The source of the transistor P5 is connected to an external power supply VEXT, the gate is connected to the control node VRWDG, and the drain is connected to the output node VRW. The source of the transistor P6 is connected to the external power supply VEXT, the gate is connected to a write overdrive signal VRW ODV, and the drain is connected to the output node VRW. A first end of the current source i1 is connected to the drains of the transistors P3 and P4, and a second end of the current source i1 is connected to a ground voltage GND. A power supply voltage for a write amplifier is output from the output node VRW.

The source of a transistor P7 is connected to the output of the inverter circuit INV1, the gate is connected to a control signal VRW06, and the drain is connected to the gates of the transistors P1 and P2. The source of a transistor P8 is connected to the external power supply VEXT, the gate is connected to the control signal VRW06, and the drain is connected to the drain of a transistor NI and the control node VRWDG. The drain of the transistor N1 is connected to the drain of the transistor P8 and the control node VRWDG, the gate is connected to a control signal VRW07, and the source is connected to the ground voltage GND. The control signal VRW07 is input to the inverter circuit INV1, and the inverter circuit INV1 supplies the output to the sources of the transistors P1, P2, and P7. The power supply voltage of the inverter circuit INV1 is the external power supply VEXT, and the output of the inverter circuit INV1 is the power supply of the current mirror circuit.

The operation of the write amplifier power generating circuit 8 will now be described. In the write amplifier power generating circuit 8, two types of output are provided: the output from the transistor P6 and the output from the transistor P5 in the current mirror differential amplifier circuit. The transistor P6 is controlled by the write overdrive signal VRW ODV and outputs a write overdrive voltage VEXT to the output node VRW. The transistor P6 is controlled independently. The control of the output from the transistor P5 in the current mirror differential amplifier circuit will now be described.

It is assumed that a voltage VRW is always input as the reference voltage VRWR. When the levels of the control signals VRW06 and VRW07 are low, the level of the control signal VRW06 is low. Thus, the transistors P7 and P8 are turned on, and the transistors P1, P2, and P5 are turned off. The level of the output of the inverter circuit INV1 is high, and thus the power supply voltage VEXT is applied to the current mirror circuit. However, the transistors P1 and P2 are turned off. In this case, the circuit does not function as a current mirror circuit. Moreover, the transistor P5 is turned off, and thus the voltage VRW of the output node VRW is kept at a level achieved in the preceding cycle.

When the levels of the control signals VRW06 and VRW07 are high, the transistors P7 and P8 are turned off, and the level of the output of the inverter circuit INV1 is low, so that the power supply voltage of the current mirror circuit is set to the ground voltage GND. Thus, in this case, the circuit does not function as a current mirror circuit. When the transistor N1 is turned on, the control node VRWDG is set to the ground voltage GND, so that the transistor P5 is turned on, and the write overdrive voltage VEXT is output from the output node VRW. When the level of the control signal VRW06 is high, and the level of the control signal VRW07 is low, the transistors P7, P8, and N1 are turned off, and the level of the output of the inverter circuit INV1 is high, so that the power supply voltage VEXT is supplied to the current mirror circuit. The circuit in this status functions as a general current mirror differential constant voltage power circuit, and the same voltage as the reference voltage VRWR is output from the output node VRW.

The current mirror differential amplifier circuit outputs the following voltages: When the levels of the control signals VRW06 and VRW07 are low, the output node VRW is floating, and the preceding status of the output node VRW is kept. When the levels of the control signals VRW06 and VRW07 are high, the write overdrive voltage VEXT is output by the transistor P5. When the level of the control signal VRW06 is high, and the level of the control signal VRW07 is low, the circuit functions as a general current mirror differential constant voltage power circuit, and the same voltage as the reference voltage VRWR is output. Moreover, in the write amplifier power generating circuit 8, the write overdrive voltage VEXT can be output to the output node VRW from the transistor P6, which is independently controlled by the write overdrive signal VRW ODV.

Write operations in the case of the tRCD MINIMUM will now be described with reference to FIG. 10, in which the write amplifier power generating circuit 8 is used. It is assumed that the voltage VRW from the write amplifier power generating circuit 8 shown in FIG. 9 is supplied to a power supply VRW of a write amplifier 6 of FIG. 5. In the initial status, the levels of the control signals VRW06 and VRW07 are low, the level of the write overdrive signal VRW ODV is high, and the output node VRW is floating and is kept at a voltage achieved in the preceding cycle.

In FIG. 10, the waveforms of the following items in write operations are shown: the word line WL, the sense overdrive signal ODV, the sense enable signal SE, a RAS-TIME-OUT signal RTO, the write enable signal WAE, the write overdrive signal VRW ODV, the control signal VRW06, the control signal VRW07, the control node VRWDG, the output VRW of the write amplifier power circuit, the column selection switches YSW, the node VDL of the sense amplifier power circuit, and the pair of the bit lines BIT T and BIT N. Regarding the pair of the bit lines BIT T and BIT N, full lines indicate parts of the pair of the bit lines BIT T and BIT N near the sense amplifier, and dot lines indicate other parts of the pair of the bit lines BIT T and BIT N far from the sense amplifier.

When the selected word line WL is activated, a small voltage difference based on the high and low levels of data stored in a memory cell occurs in the pair of the bit lines BIT T and BIT N. The waveforms in the pair of the bit lines BIT T and BIT N are shown, in a case where the level of the data stored in the memory cell is low. Voltages are supplied as the high power supply voltage (SAP)/the low power supply voltage (SAN) of the sense amplifier according to the sense overdrive signal ODV and the sense enable signal SE. The power supply voltage VEXT is supplied as the high power supply voltage (SAP) according to the sense overdrive signal ODV. The ground voltage GND is supplied as the low power supply voltage (SAN). The sense amplifier quickly amplifies the pair of the bit lines BIT T and BIT N with the high power supply voltage (SAP)/the low power supply voltage (SAN) supplied to the sense amplifier.

When the write enable signal WAE is activated, the write overdrive signal VRW ODV is activated. The overdrive voltage VEXT is supplied from the write amplifier power generating circuit 8 to the write amplifier. When the column selection switches YSW are selected, write data is written to the pair of the bit lines BIT T and BIT N and the sense amplifier. Since the high level of the write data is VEXT, and the gate voltage of a corresponding column selection switch YSW is also VEXT, VEXT−Vtn is written to the pair of the bit lines BIT T and BIT N. In this way, in the status in which the sense amplifier is overdriven, the power supply of the write amplifier is also overdriven. Moreover, the levels of the control signals VRW06 and VRW07 become high according to the write enable signal WAE. The transistor N1 is turned on according to the control signal VRW07, the control node VRWDG is set to the low level, and the overdrive voltage VEXT is supplied from the transistor P5.

When amplification of the parts of the pair of the bit lines BIT T and BIT N near the sense amplifier has been almost completed, the sense overdrive signal ODV is deactivated. The write overdrive signal VRW ODV and the control signal VRW07 are also deactivated (alternatively, the deactivation may be performed according to the signal RTO, which is described below). The high voltage power supply SAP of the sense amplifier is changed to the internal voltage VDL. When the transistor P6 is turned off and when the transistors P1 and P2 in the current mirror differential amplifier circuit are turned on so that the circuit functions as a general current mirror differential constant voltage power circuit, the voltage VRW is output as the power supply of the write amplifier.

Subsequently, the high level of write data is the voltage VRW output from the write amplifier power generating circuit 8. In this case, the write level can be set to the high voltage power supply SAP of the sense amplifier by setting the reference voltage VRWR of the write amplifier power generating circuit 8 to the internal voltage VDL and setting the voltage VRW to the internal voltage VDL. In this status, the column selection switches YSW are switched, so that successive write operations are performed. Even though successive write operations are performed, since the write level is the internal voltage VDL, the voltage in a bit line is not excessively boosted.

In this way, in a first write cycle during an overdrive period at the beginning of a sensing operation, write operations are performed with an overdrive voltage, and in a second write cycle after sense overdrive is completed, write operations are performed with the internal voltage VDL. During a sense overdrive period, since an overdrive voltage that is higher than the internal voltage VDL is supplied to the sense amplifier, write operations are performed with the overdrive voltage. The overdrive voltage is supplied from the sense amplifier and the write amplifier. However, at this time, since the other parts of the pair of the bit lines BIT T and BIT N far from the sense amplifier are being amplified, the charge is used to amplify the other parts of the pair of the bit lines BIT T and BIT N far from the sense amplifier. Thus, the voltage in a bit line is not excessively boosted. After sense overdrive is completed, write operations are performed with the internal voltage VDL. Thus, although successive write operations are performed, since the write voltage is the internal voltage VDL, the voltage in a bit line is not excessively boosted. In this way, the high level voltage of write data is changed depending on the type of write cycle.

The write overdrive signal VRW ODV and the control signal VRW07 may be activated/deactivated according to the signal RTO indicated by a dotted line in FIG. 10 instead of the sense overdrive signal ODV. The write overdrive signal VRW ODV may be activated/deactivated by a combination of the write enable signal WAE and the sense overdrive signal ODV or a combination of the write enable signal WAE and the signal RTO. Moreover, the write overdrive signal VRW ODV may be activated/deactivated by a combination of the write enable signal WAE and a signal obtained by monitoring whether data from a memory cell is being amplified by the potential in bit lines.

The signal RTO indicates that a RAS signal can be deactivated because data in a memory cell is restored and a refresh operation is completed. That is to say, the signal RTO is generated when amplification has been performed sufficiently in parts of bit lines far from the sense amplifier. Thus, before the signal RTO is generated, amplification has not been performed sufficiently in the parts of the bit lines far from the sense amplifier. Accordingly, even when an overdrive write operation is performed, since the overdrive charge is used to amplify the bit lines, the voltage in a bit line is not excessively boosted. On the other hand, after the signal RTO is generated, the parts of the bit lines far from the sense amplifier are sufficiently amplified, and the voltage is boosted to the internal voltage VDL. Thus, when an overdrive write operation is performed, the voltage in a bit line is excessively boosted by the overdrive charge. In this way, even when the write overdrive signal VRW ODV is deactivated according to the signal RTO, the voltage in a bit line is not excessively boosted.

Moreover, the polarities of the write overdrive signal VRW ODV and the control signal VRW07 are inverted. Both of these signals cause an overdrive voltage for a write operation to be generated. Thus, the control signal VRW07 is also a type of write overdrive signal. Accordingly, after the control signal VRW07 is deactivated according to the sense overdrive signal ODV, and the circuit is on standby as a current mirror differential constant voltage power circuit, the write overdrive signal VRW ODV may be deactivated. In this way, when two overdrive components for a write operation are provided, an advantage is conferred in that the intensity of a write overdrive operation can be freely set. Alternatively, the write overdrive signal VRW ODV and the transistor P6 may be omitted, and only the transistor P5 may be provided. Moreover, the point in time when a write overdrive operation is stopped can be freely set in a period between the time when the sense overdrive signal ODV is deactivated and the time when the signal RTO is generated.

FIG. 11 shows a write amplifier power generating circuit according to a second embodiment. The write amplifier power generating circuit according to the second embodiment is substantially the same as the write amplifier power generating circuit according to the first embodiment shown in FIG. 9 except in that a regulator transistor P9 is added to the differential transistor section. The source of the transistor P9 is connected to the source of the transistor P3, the gate is connected to a second reference voltage VRWR2, and the drain is connected to the drain of the transistor P3. The transistor P9 is connected in parallel with the transistor P3, and the two transistors constitute the reference voltage side. The components other than the transistor P9 are the same as those shown in FIG. 9. Thus, the same reference letters and numerals as in FIG. 9 are assigned to these components, and the description is omitted here. The output voltage VRW at a necessary level can be generated on the basis of the reference voltages input to the gates of the transistor P3 and the transistor P9. The operation can be easily understood. Thus, the description is omitted here.

FIG. 12 shows a write amplifier power generating circuit according to a third embodiment. The write amplifier power generating circuit according to the third embodiment is substantially the same as the write amplifier power generating circuit according to the second embodiment shown in FIG. 11 except in that a connection control transistor P10 that controls connection and disconnection of the transistor P9 is connected in series with the transistor P9. The source of the transistor P10 is connected to the source of the transistor P3, the gate is connected to a connection control signal VRWON, and the drain is connected to the source of the transistor P9. The connection control transistor P10 controls whether the transistor P9 is connected or nor. The components other than the transistor P10 are the same as those shown in FIG. 11. Thus, the same reference letters and numerals as in FIG. 11 are assigned to these components, and the description is omitted here. Moreover, the operation can be easily understood. Thus, the description is omitted here.

Reference voltage generating circuits according to embodiments of the present invention will now be described, which generate reference voltages that are used in write amplifier power generating circuits. A reference voltage generating circuit is based on a differential amplifier circuit and generates a constant voltage VRW2 from an internal voltage VDL. FIG. 13 shows a first reference voltage generating circuit that generates a constant voltage (VDL+Vtn), and FIG. 14 shows a second reference voltage generating circuit that generates a constant voltage (VDL+2Vtn).

The first reference voltage generating circuit shown in FIG. 13 includes a differential amplifier AMP, transistors P11 and N2, and a current source i2. In the differential amplifier AMP, the reference input is the internal voltage VDL, and the input subjected to comparison with the reference input is a node of the transistor N2 and the current source i2. The differential amplifier AMP supplies the output to the gate of the transistor P11. The source of the transistor P11 is connected to a power supply VEXT, the gate is connected to the output of the differential amplifier AMP, and the drain is connected to the output VRW2. The drain and gate of the transistor N2 are connected to the output VRW2, and the source is connected to one of the inputs of the differential amplifier AMP and the current source i2. A first end of the current source i2 is connected to the source of the transistor N2 and the one of the inputs of the differential amplifier AMP, and a second end of the current source i2 is connected to a ground voltage GND. The first reference voltage generating circuit compares the internal voltage VDL with the voltage of the node of the transistor N2 and the current source i2, and outputs the output VRW2=VDL+Vtn, where Vtn is a threshold voltage of the transistor N2.

The second reference voltage generating circuit shown in FIG. 14 is different from the first reference voltage generating circuit shown in FIG. 13 in that a transistor N3 is added. The drain and gate of the transistor N3 are connected to the source of the transistor N2, and the source is connected to one of the inputs of the differential amplifier AMP and the current source i2. The connections between the other components are the same as those in the first reference voltage generating circuit. The second reference voltage generating circuit compares the internal voltage VDL with the voltage of a node of the transistor N3 and the current source i2, and outputs the output VRW2=VDL+2Vtn. The transistor N2 and N3 have the same threshold voltage Vtn.

In the present invention, successive write operations are performed by the overdrive method in a period during which the sense amplifier is overdriven or a period until a pair of bit lines is sufficiently amplified. The present invention is characterized in that the write overdrive signal is deactivated according to the sense overdrive signal or the signal RTO. Moreover, the present invention provides the write amplifier power generating circuit and the constant voltage generating circuit, which perform these operations. In the present invention, an excessive increase in the voltage in a bit line and an erroneous sensing operation due to successive write operations can be prevented. The overdrive write method, the write amplifier power generating circuit, which prevent the voltage in a bit line from being excessively boosted, and the semiconductor memory device including the same can be obtained.

The embodiments according to the present invention have been described. However, the present invention is not limited to the embodiments and can be changed and embodied in various forms. The combinations of the embodiments are not limited, and any combination is possible. The present invention can be changed and embodied in various forms without departing from the concept of the present invention. Needless to say, these changes are covered by the present invention.

What is claimed is:

1. A semiconductor memory device comprising:
a write amplifier power generating circuit that supplies, as a power supply voltage of a write amplifier, a first voltage in a first write cycle in which a write overdrive signal is activated and a second voltage in a second write cycle in which the write overdrive signal is deactivated,
wherein the second voltage is a high level voltage to be written to a memory cell, and the first voltage is higher than the second voltage and, wherein the write overdrive signal is activated by activating a RAS-TIME-OUT signal and a write enable signal and deactivated by deactivating the RAS-TIME-OUT signal.

2. The semiconductor memory device according to claim 1, wherein the write overdrive signal is activated by activating a write enable signal and deactivated by the time amplification in a pair of bit lines that are amplified according to data stored in a memory cell is completed.

3. The semiconductor memory device according to claim 1, wherein the write overdrive signal is activated by activating a sense overdrive signal and a write enable signal and deactivated by deactivating the sense overdrive signal.

4. The semiconductor memory device according to claim 1, wherein the write amplifier power generating circuit includes current mirror transistors, differential input transistors to which a reference voltage and an output voltage are individually input, and a driver transistor, and voltages of gates of the current mirror transistors and the driver transistor are controlled.

5. The semiconductor memory device according to claim 4, wherein the write amplifier power generating circuit further includes a regulator transistor connected in parallel with one of the differential input transistors to which the reference voltage is input, and a second reference voltage is input to a gate of the regulator transistor.

6. The semiconductor memory device according to claim 5, wherein the write amplifier power generating circuit further includes a connection control transistor connected in series with the regulator transistor, and a connection control signal is input to a gate of the connection control transistor.

7. An overdrive write method in which, in individual write cycles, a write high level from a write amplifier is changed depending on a status of a pair of bit lines that are amplified according to data stored in a memory cell,
wherein the write high level is set to a first voltage in a first write cycle in which the pair of the bit lines are being amplified and is set to a second voltage in a second write cycle after amplification in the pair of the bit lines has been completed,
wherein the second voltage is a high level voltage to be written to a memory cell, and the first voltage is higher than the second voltage and,
wherein switching from the first write cycle to the second write cycle is performed according to a RAS-TIME-OUT signal.

8. The overdrive write method according to claim 7, wherein switching from the first write cycle to the second write cycle is performed in synchronization with deactivation of a sense overdrive signal.

9. A semiconductor memory device that performs a write operation by the overdrive write method according to claim 8 or 7.

10. A semiconductor memory device comprising:
a memory cell;
a bit line connected with the memory cell;
a sense amplifier that operates on a first operating voltage during a first period of time to amplify a potential of the bit line and on a second operating voltage during a second period of time to further amplify the potential of the bit line, the second period of the time following the first period of time, the first operating voltage being larger in absolute value than the second operating voltage; and
a write amplifier that responds to a data to be written into the cell to supply the bit line with a first writing voltage during a third period of time and with a second writing voltage during a fourth period of time, the first writing voltage being larger in absolute value than the second writing voltage, the third period of time being included in the first period of time, the fourth period of time being included in the second period time.

11. The semiconductor memory device according to claim 10, wherein the write amplifier is connected with the bit line via a transfer switch.

12. The semiconductor memory device according to claim 10, wherein the first operating voltage is the same as the first writing voltage and the second operating voltage is the same as the second writing voltage.

13. The semiconductor memory device according to claim 10, further comprising a write amplifier power generating circuit that supplies the write amplifier with the first writing voltage during the first period of time and with the second writing voltage during the second period of time.

* * * * *